United States Patent [19]

Pavie

[11] Patent Number: 4,845,591
[45] Date of Patent: Jul. 4, 1989

[54] DEVICE FOR HOLDING AN ELECTRONIC EQUIPMENT HOUSING ON A TRAY

[75] Inventor: Denis Pavie, Ballancourt Sur Essonne, France

[73] Assignee: Vibrachoc, Evry Cedex, France

[21] Appl. No.: 188,575

[22] Filed: Apr. 29, 1988

[30] Foreign Application Priority Data

May 14, 1987 [FR] France ............................. 8706783

[51] Int. Cl.⁴ ................................ H02B 1/04
[52] U.S. Cl. .............................. 361/391; 361/338; 211/41; 312/223
[58] Field of Search ............... 211/26, 41; 312/223, 312/320; 439/362, 364, 365, 359, 528–530; 361/338, 339, 390, 391, 392, 415, 429

[56] References Cited

U.S. PATENT DOCUMENTS

| | | | |
|---|---|---|---|
| 3,191,097 | 6/1965 | Dano | 361/391 |
| 3,270,253 | 8/1966 | Binder | 361/391 |
| 3,626,253 | 12/1971 | Sturdivan | 361/338 |
| 4,236,190 | 11/1980 | Hollingsead et al. | |
| 4,361,372 | 11/1982 | Majkrzak et al. | |
| 4,458,296 | 7/1984 | Bryant et al. | |

FOREIGN PATENT DOCUMENTS 1079366 8/1967 United Kingdom .

Primary Examiner—Gerald P. Tolin
Attorney, Agent, or Firm—Sughrue, Mion, Zinn, Macpeak & Seas

[57] ABSTRACT

A device for holding an electronic equipment housing (1) on a tray (10) comprising a bottom (11), a vertical backplate (12) provided with the male portion (15) of a connector, and two side flanks (13), the device including at least one locking device (20) situated at the front of the tray and mechanically connected to the front face (2) of the housing (1), and a sideways locking element for the housing, said locking element being constituted by at least one tab (30) fixed to the tray (10) and operatively engaging a corresponding at least one notch (2A) provided in the front face (2) of the housing. The invention is applicable to housings mounted in aircraft.

5 Claims, 4 Drawing Sheets

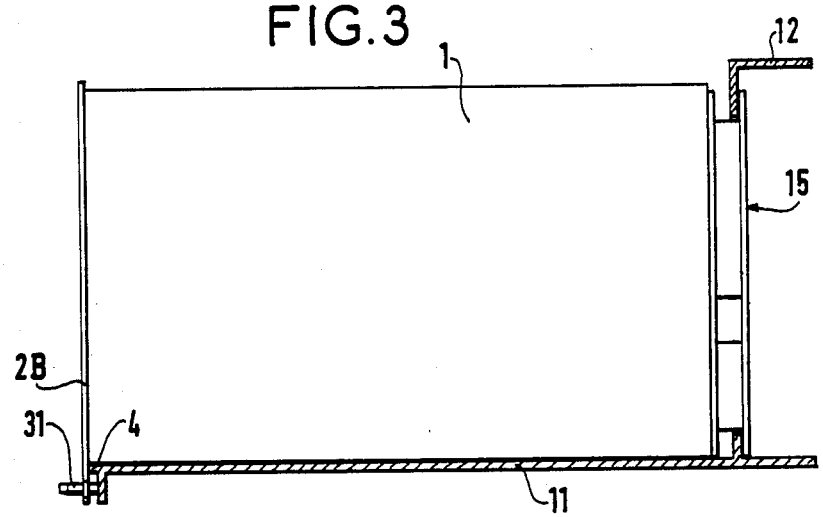
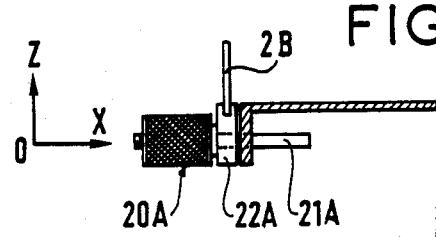
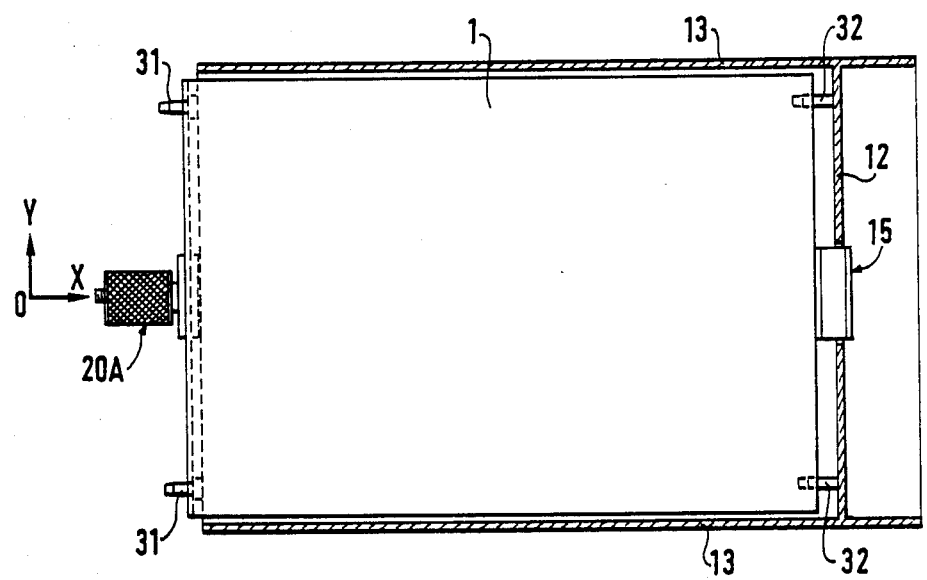

DEVICE FOR HOLDING AN ELECTRONIC EQUIPMENT HOUSING ON A TRAY

The present invention relates to a device for holding an electronic equipment housing on a tray, said tray being constituted, for example, by a tray installed on board on aircraft.

BACKGROUND OF THE INVENTION

Such a tray is generally constituted by a bottom having a perforated central diaphragm via which the housing is ventilated, a vertical backplate receiving the male portion of a connector, and two side walls which guide the housing while it is being installed or removed.

The rear portion of the housing includes the female portion of the connector, while the front portion of the housing includes a face fitted with a handle. Since the female portion of the connector is provided with relatively fragile pins, it is necessary for the housing to be installed and removed in an accurate manner.

In order to avoid damaging the pins, prior art devices generally comprise two locking devices which are permanently connected to the tray and which are hinged thereto in order to enable each of them to latch onto a lug fixed to the front face of the housing. The inclination of these locking devices serves to apply both a longitudinal component for connection purposes and a vertical component for pressing the housing down against the bottom of the tray. Once the housing has been installed, the locking devices are effective in preventing the housing from being raised, however, when subjected to high levels of vibration or shock, as specified in recent user specifications, the housing is liable to oscillate sideways at its front end. The connector is then being used as a pivot and also as a longitudinal thrust point for the housing, and these two functions are prejudicial to connector length of life.

The device of the present invention seeks to fix the housing relative to the tray both sideways and longitudinally using means other than the connector, such that the connector is not required to perform housing-fixing functions.

SUMMARY OF THE INVENTION

In a first embodiment of the invention for providing sideways restraint for the housing, the present invention provides a device for holding an electronic equipment housing on a tray comprising a bottom, a vertical backplate provided with the male portion of a connector, and two side flanks, the device including at least one locking device situated at the front of the tray and mechanically connected to the front face of the housing, and sideways locking means for the housing, said locking means being constituted by at least one tab fixed to the tray and associated with at least one notch provided in the front face of the housing.

In variant of the first embodiment, the locking means is constituted by at least one finger fixed to the tray and associated with at least one orifice provided through the front face of the housing, with said finger(s) also providing vertical locking of the housing.

In a second embodiment for longitudinally fixing the housing, the present invention provides a device for holding an electronic equipment housing on a tray comprising a bottom, a vertical backplate provided with the male portion of a connector, and two side flanks, the device including at least one locking device situated at the front of the tray and mechanically connected to the front face of the housing, characterized in that it includes means for locking the housing longitudinally, said means being constituted by putting the front face of the housing into abutment against the tray.

Naturally, these two embodiments may be associated in a single device. In this case, the sideways locking means is constituted by a tab fixed to the tray and associated with at least one groove provided in the front face of the housing, or by at least one finger fixed to the tray and associated with at least one orifice provided on the front face of the housing, with said finger(s) also locking the housing in a vertical direction, and the longitudinal locking means for the housing is constituted by putting the front face of the housing into abutment against the tray.

According to an improvement of the device which is applicable to a sideways locking means constituted by at least one finger, the device further includes at least one finger fixed to the tray and associated with at least one orifice through the rear face of the housing, said finger(s) together with the front fingers providing total vertical locking for the housing.

According to another improvement of the device, applicable to the second embodiment with longitudinal locking means, the device according to the invention further includes slackabsorbing and force-absorbing means comprising a plate in abutment against resilient means, said absorbing means being capable of being situated adjacent to the backplate or adjacent to the rear face of the housing.

BRIEF DESCRIPTION OF THE DRAWINGS

Embodiments of the invention are described by way of example with reference to the accompanying drawings, in which:

FIG. 3 shows two embodiments used in association with each other, in which the sideways locking means is constituted by at least one finger at the front face, with the locking device then being modified as shown in FIG. 3a;

FIG. 4 is a plan view of an improvement of the device in which the rear face of the housing also includes at least one finger;

MORE DETAILED DESCRIPTION

Figure 1:
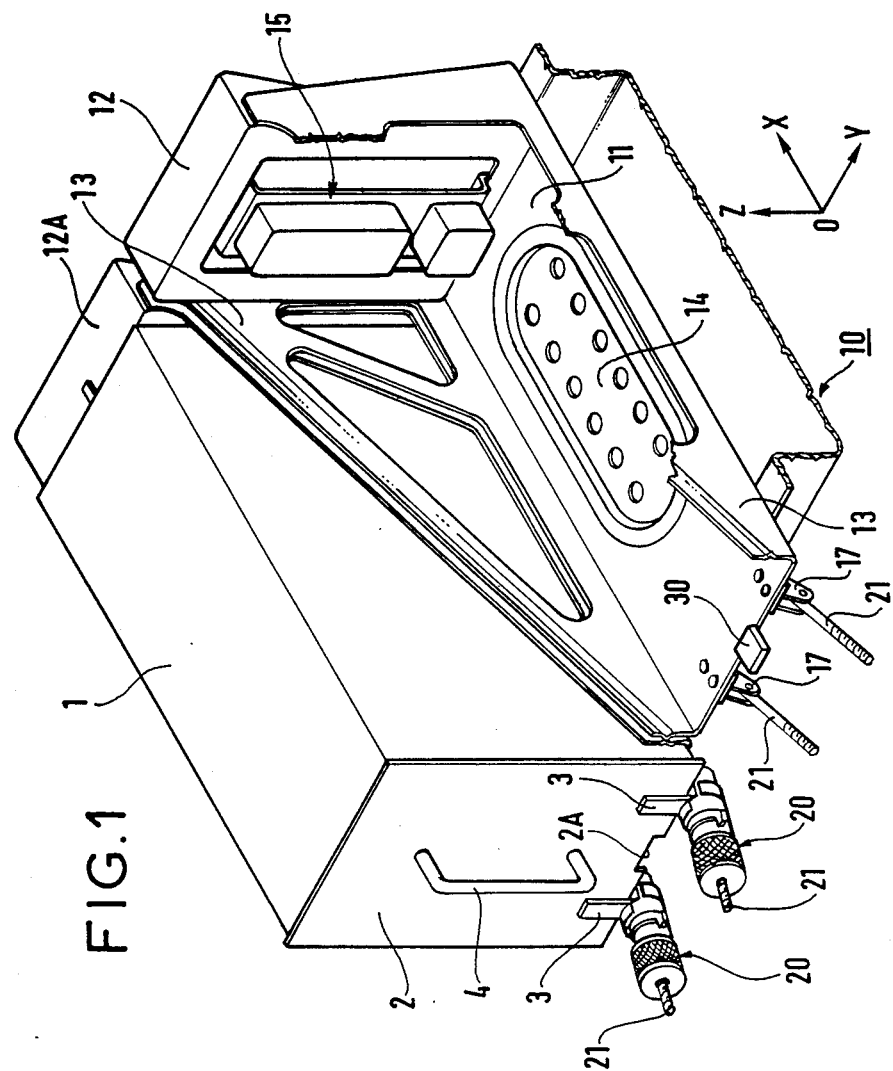
FIG. 1 is a perspective view of two trays, one of which is fitted with a housing and the other of which has no housing, said figure showing a first embodiment of the device.

FIG. 1 shows two trays, one fitted with a housing 1 and the other not so fitted. This makes it possible to show the structure of a tray. A tray 10 comprises a bottom 11 fitted with a diaphragm 14 for ventilating a housing, a rear plate 12 on which a plate 15 supporting the male portion of a connector is mounted, and finally two side flanks 13 which are in the form of open triangles.

Two forks 17 are mounted at the front end of the underside of the tray, with each fork holding a shaft 21 of a locking device 20, with each locking device being connected to a lug 3 on the front face 2 of a housing while it is being installed, while it is being held in position, or while it is being removed.

It will thus be understood, that in order to install a housing, the operator places the housing on the tray and pushes it until the female portion of the connector fitted with pins comes into contact with the male portion. The operator then hooks each locking device onto the corresponding lug 3 and tightens the locking devices which thrust the housing longitudinally along the axis OX+ until the connector is properly plugged together. The angle between the locking device and the axis OX serves to ensure that the front of the housing cannot be raised along the axis OZ+.

In accordance with the invention, the front of the tray is provided with a tab 30 and the front face 2 of the housing 1 includes a notch 2A which engages around the tab 30, thereby preventing any sideways movement of the housing along the axis OY. Naturally, in this figure, the tab 30 on the tray fitted with a housing has not been shown in order to ensure that the shape of the notch 2A is shown clearly.

Figure 2:
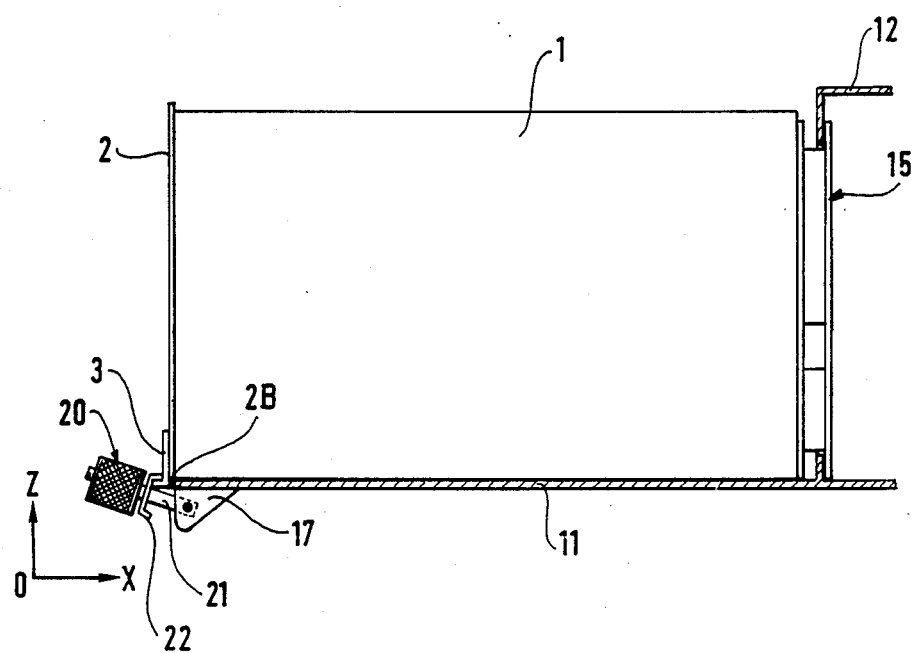
FIG. 2 is a side view of a tray fitted with a housing and showing a second embodiment of the device.

In FIG. 2, which is a side view of a housing 1 placed on the bottom 11 of a tray, it can be seen that the front face 2 of the housing 1 is extended, in accordance with the invention, by a rim 2B.

Each of the locking devices 20 having a shaft 21 hinged to a fork 17 is hooked by means of a ring 22 onto a lug 3 projecting from the housing.

In accordance with the invention, at the ends of their strokes, the locking devices lock the rim 2B of the front face of the housing against the bottom 11 of th tray, thereby preventing any longitudinal motion of the housing along the axis OX.

In FIG. 3, a finger 31 is fixed to the tray and the face 2 of the housing has a corresponding orifice therethrough. It will thus be understood that the finger can advantageously replace a tab as shown in FIG. 1, since the finger serves not only to prevent the housing from moving sideways along the axis OY, but also serves to prevent it from moving vertically along the axis OZ+.

By preventing the housing from moving vertically, it becomes possible to use locking devices which are not hinged for the purpose of providing a vertical component. Simple locking devices as shown in FIG. 3A are then sufficient. Such a simple locking device 20A comprises a shaft 21A which is not hinged relative to the tray and a ring 22A which engages over the rim 2B of the front face of the housing. Naturally, there may be two fingers disposed along the axis OY symmetrically about the main axis of the apparatus together with a single central locking device as shown in FIG. 4. FIG. 3 shows sideways locking by means of at least one finger in association with longitudinal locking of the housing by abutment along the axis OX+, however such an association is not indispensible.

FIG. 4 is a plan view showing a central locking device 20A with two front fingers 31 and also with two rear fingers 32 which are fixed to the backplate 12 and which engage in orifices made into the housing. The housing is therefore completely locked against vertical motion.

Figure 5:
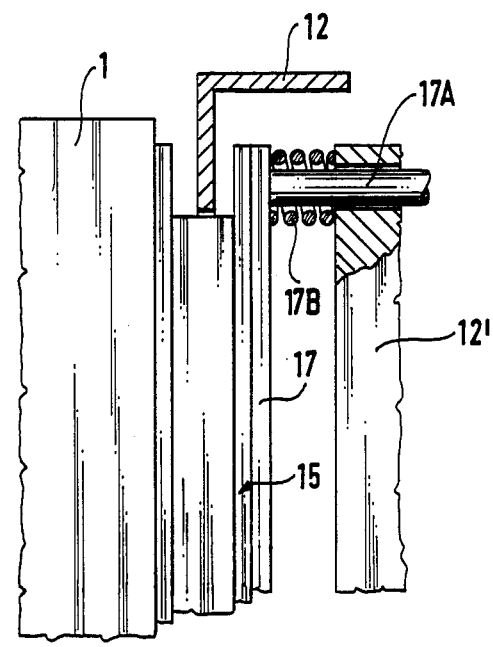
FIG. 5 shows absorbing means situated adjacent to the backplate of the tray.

FIG. 5 shows means for absorbing slack and for absorbing forces, said absorbing means being situated adjacent to the backplate 12 and being constituted by a sliding spacer 17 mounted on guides 17A which slide in orifices through a part 12' which is fixed to the backplate 12. Springs 17B are interposed around each guide between the spacer 17 and the fixed part 12'. When the housing is being installed, the plate 15 bears against the spacer 17 with the springs 17B opposing motion of the plate-and-spacer assembly, and thus opposing motion of the housing along the axis OX+.

Figure 6:
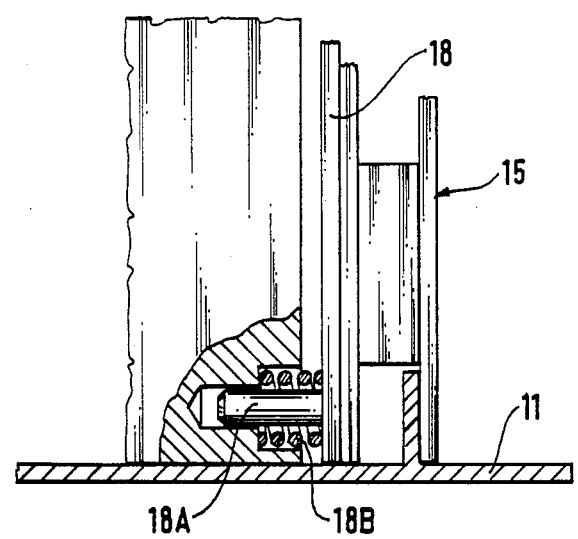
FIG. 6 shows absorbing means situated adjacent to the rear face of the housing.

FIG. 6 shows an equivalent absorbing means which is situated adjacent to the housing. This means is constituted by a fixed plate 18 provided with guides 18A over which the housing slides, with springs 18B being interposed between the housing of the plate 18.

When the housing is being installed, it bears against the springs 18B which oppose displacement of the housing along the axis OX+.

I claim:

1. A device holding an electronic equipment housing having a front face on a tray having a front and a back, said tray further comprising a bottom a vertical backplate provided with a male portion of a connector, and two side flanks, the device including at least one locking device situated at the front of the tray and mechanically connected to the front face of the housing, and sideways locking means for the housing, and wherein the sideways locking means is constituted by at least one tab fixed to the tray and respectively, at least one notch provided in the front face of the housing, aligned therewith, and engageable around the tab.

2. A device holding an electronic equipment housing having a front face on a tray having a front and a back, said tray comprising a bottom a vertical backplate provided with a male portion of a connector, and two side flanks, the device including at least one locking device situated at the front of the tray and mechanically connected to the front face of the housing, and sideways locking means for the housing and wherein the locking means is constituted by at least one finger fixed to the tray and operatively engaging, respectively, at least one orifice, aligned therewith, provided through the front face of the housing whereby said finger(s) also provides vertical locking of the housing.

3. A device holding an electronic equipment housing having a front face on a tray having a front and a back, said tray further comprising a bottom, a vertical backplate provided with a male portion of a connector, and two side flanks, the device including at least one locking device situated at the front of the tray and mechanically connected to the front face of the housing, the device further including means for locking the housing longitudinally, said means being constituted by the front face of the housing including a rim abutting against the front of the tray, and wherein said housing front face comprises a notch, and said device includes sideways locking means for the housing constituted by at least one tab fixed to the tray and engaged with said notch such that the notch engages around said tab.

4. A device according to claim 3, including sideways locking means for the housing constituted by at least one finger fixed to the tray and operatively engaging at least one aligned orifice provided through the front face of the housing, with said finger(s) also vertically locking said housing.

5. A device according to claim 2, including at least one further finger fixed to the tray and operatively engaging at least one aligned orifice through a rear face of the housing, such that said fingers vertically lock said housing at both the front and rear face thereof.

* * * * *